(12) United States Patent
Black et al.

(10) Patent No.: US 8,852,981 B2
(45) Date of Patent: Oct. 7, 2014

(54) ELECTRICAL CONTACTS TO NANOSTRUCTURED AREAS

(71) Applicant: Bandgap Engineering, Inc., Salem, NH (US)

(72) Inventors: Marcie R. Black, Lincoln, MA (US); Joanne Forziati, Everett, MA (US); Michael Jura, Santa Monica, CA (US); Jeff Miller, Brookline, MA (US); Brian Murphy, Revere, MA (US); Adam Standley, Cambridge, MA (US)

(73) Assignee: Bandgap Engineering, Inc., Salem, NH (US)

( * ) Notice: Subject to any disclaimer, the term of this patent is extended or adjusted under 35 U.S.C. 154(b) by 140 days.

(21) Appl. No.: 13/622,864

(22) Filed: Sep. 19, 2012

(65) Prior Publication Data
US 2013/0099345 A1    Apr. 25, 2013

Related U.S. Application Data

(60) Provisional application No. 61/536,243, filed on Sep. 19, 2011.

(51) Int. Cl.
| | |
|---|---|
| *H01L 21/00* | (2006.01) |
| *H01L 21/283* | (2006.01) |
| *H01L 21/285* | (2006.01) |
| *H01L 29/06* | (2006.01) |
| *H01L 29/41* | (2006.01) |
| *H01L 31/0224* | (2006.01) |
| *H01L 31/0352* | (2006.01) |

(52) U.S. Cl.
CPC ........ *H01L 21/28506* (2013.01); *H01L 21/283* (2013.01); *H01L 29/0676* (2013.01); *H01L 29/413* (2013.01); *H01L 31/0224* (2013.01); *H01L 31/022425* (2013.01); *Y02E 10/50* (2013.01); *H01L 31/035218* (2013.01)
USPC .............................. 438/48; 438/676; 257/436

(58) Field of Classification Search
CPC .................. H01L 31/0224; H01L 31/035227; H01L 21/283; H01L 21/28506; H01L 31/02245
USPC ..................................... 257/436; 438/48, 676
See application file for complete search history.

(56) References Cited

U.S. PATENT DOCUMENTS

| | | | |
|---|---|---|---|
| 4,726,850 | A | 2/1988 | Wenham et al. |
| 6,986,838 | B2 | 1/2006 | Babic et al. |
| 7,691,720 | B2 | 4/2010 | Furukawa et al. |
| 8,617,970 | B2 | 12/2013 | Koto et al. |
| 2005/0117194 | A1 | 6/2005 | Kim et al. |

(Continued)

OTHER PUBLICATIONS

I. Tobías, C. del Cañizo, J. Alonso, "Crystalline silicon solar cells and modules," Chapter 7 in A. Luque, Handbook of Photovoltaic Science and Engineering (John Wiley & Sons 2003).

(Continued)

*Primary Examiner* — Long K Tran

(57) ABSTRACT

A process is provided for contacting a nanostructured surface. In that process, a substrate is provided having a nanostructured material on a surface, the substrate being conductive and the nanostructured material being coated with an insulating material. A portion of the nanostructured material is at least partially removed. A conductor is deposited on the substrate in such a way that it is in electrical contact with the substrate through the area where the nanostructured material has been at least partially removed.

27 Claims, 14 Drawing Sheets

(56) References Cited

U.S. PATENT DOCUMENTS

| | | |
|---|---|---|
| 2006/0207647 A1* | 9/2006 | Tsakalakos et al. .......... 136/256 |
| 2007/0278476 A1 | 12/2007 | Black |
| 2008/0210937 A1* | 9/2008 | Kobayashi et al. ............. 257/51 |
| 2008/0296551 A1 | 12/2008 | Nihei et al. |
| 2009/0256134 A1 | 10/2009 | Buchine et al. |
| 2010/0045160 A1* | 2/2010 | Dayton et al. ................ 313/414 |
| 2010/0092888 A1 | 4/2010 | Buchine et al. |
| 2012/0181502 A1 | 7/2012 | Modawar et al. |

OTHER PUBLICATIONS

K. Kang, W. Cai, "Size and temperature effects on the fracture mechanisms of silicon nanowires: Molecular dynamics simulations," International Journal of Plasticity 26, 1387-1401 (2010).

B.A. Gozen O.B. Ozdoganlar, "A Rotating-Tip-Based Mechanical Nano-Manufacturing Process: Nanomilling," Nanoscale Research Letters 5, 1403-1407 (2010).

International Search and Patentability Report for PCT counterpart of present application.

* cited by examiner

ELECTRICAL CONTACTS TO NANOSTRUCTURED AREAS

CROSS-REFERENCE TO RELATED APPLICATIONS

This application claims priority to U.S. Provisional Application Ser. No. 61/536,243, filed Sep. 19, 2011, which is incorporated by reference in its entirety.

BACKGROUND OF THE INVENTION

Nanowire arrays are seeing increasing use in a variety of applications. See, e.g., U.S. Patent Application No. 20090256134. An exemplary silicon nanowire array might consist of a collection of silicon nanowires, on the order of 100 nm in diameter, on the order of several micrometers in height, and of approximately cylindrical or frustoconical shape. The axes of the nanowires run approximately parallel to each other. Each is attached at an end to a silicon substrate and is very roughly perpendicular to that substrate.

A silicon nanowire array on top of a silicon substrate, can alter the opto-electrical properties of the bulk silicon substrate. For example, a silicon nanowire array reduces the reflection of the silicon substrate, reduces the reflection at off-angles of incidence, and increases the absorption of the silicon in ways similar to traditional pyramids or light trapping mechanisms used in solar cells.

Some of the altered optical-electrical properties of silicon nanowires compared to bulk silicon are beneficial for solar cells. However, in order to form a solar cell, the two sides of a p-n junction need to be connected to the outside world. Unfortunately, contacting nanowires is not always easy.

One device design for nanowire solar cells places vertically aligned nanowires on top of a bulk (non-nanostructured) substrate. In this design, the back contact can easily be made from the backside of the substrate. The front contact, however, is more difficult to make.

The contact resistance increases the smaller the contact area. If contacts are made on top of the nanowire array, only the tips of the wires are in contact with the metal, and hence the contact resistance may be undesirably high. Too high contact resistance adversely impacts device efficiency.

For the types of solar cells currently manufactured, not using nanowire arrays, it is common to make contacts by screen printing. Screen printing is robust, has a high throughput, and is low-cost. The front and back contacts of a solar cell are typically formed in separate steps. For typical cell designs, silver is applied to the front, and aluminum to the back. For the front, paste is squeezed through a stainless steel or polyester fine metal mesh screen with an adjustable and finely controlled force delivered through metal or polymer squeegee. The screen defines a comb-like (finger line array and crossed bus bars) pattern designed to provide sufficient conductivity while minimizing optical shading from the metal lines. The paste is then dried at temperatures of 100-200° C. to drive off organic solvents and fired at around 800° C. to diffuse in the metal to establish a low contact resistance junction. For the back, an aluminum based paste is screen printed on the rear surface, establishing electrical contact and functioning as a back surface field. The aluminum is applied as a paste squeezed through a fine mesh screen, then fired at high temperatures to drive off organic solvents and diffuse in the aluminum to establish a low contact resistance junction. Although a continuous contact will result in lower resistance, commercial wafers utilize a back contact with an embedded mesh structure to reduce paste usage and minimize wafer warping during the subsequent high temperature processing steps. The pattern is defined in the screen by photolithography, although laser cut metal stencils may be utilized for smaller linewidths. Automatic screen printers are available that are capable of in-line, continuous operation with high throughput. These machines accept wafers from packs, cassettes or a belt line, place them with sufficient accuracy under the screen and deliver the printed wafers to the belt line. Detailed methods for screen printing are described in reference (1).

Electroplating processes have been developed as an alternative to screen printing for solar cell metallization. The process typically proceeds in two steps. In the first, a narrow groove is machined into a heavily doped region of silicon through any number of methods, including laser machining such as described by U.S. Pat. No. 4,726,850 or by other mechanical means. A metal seed layer such as nickel or copper is deposited, which immediately contacts the silicon and is chosen to have good mechanical and electrical contact to the silicon surface. In the subsequent step, the line is thickened by electroplating to increase the line conductivity. The second layer may be comprised of a distinct metal such as silver and the process parameters of each step may be chosen to optimize overall performance of the device. Areas in which there are no metal contacts may be covered with a lowly doped and passivated emitter. Linewidths for laser defined grooves for the metal seed layers may be 25-50 micrometers, reducing optical shading losses relative to screen printed methods. Alternatively, the silicon nitride layer is masked with photolithography, and etched through. The photo resist is removed and the SiN acts as a mask for electrodeposition onto the underlying silicon. Metal is then electrodeposited wherever the silicon nitride was etched. Unfortunately both these methods of electroplating require photolithography or expensive patterning techniques.

There is a need for improved techniques for making electrical contacts to nanostructured portions of a surface.

SUMMARY OF THE INVENTION

In an embodiment, a substrate having a nanostructured material on a surface is provided. The nanostructured material is removed from a portion of the surface, and an electrical contact is deposited in the portion of the surface from which the nanostructured material was removed.

In some embodiments, a process is provided for contacting a nanostructured surface. In that process, a substrate is provided having a nanostructured material on a surface, the substrate being conductive and the nanostructured material being coated with an electrically insulating material. A portion of the nanostructured material is at least partially removed. A conductor is deposited on the substrate in such a way that it is in electrical contact with the substrate through the area where the nanostructured material has been at least partially removed.

In certain embodiments, the substrate and nanostructured material which are processed comprise silicon. In certain embodiments, the nanostructured material used in the disclosed processes comprises porous silicon. In certain embodiments, the nanostructured material used in the disclosed processes comprises nanowires, which may comprise a nanowire array. In certain embodiments, the nanostructured material used in the disclosed processes comprises silicon dioxide. The electrically insulating material used in the disclosed processes may comprise alumina.

In some embodiments, the step of removing nanostructured material and insulating material comprises applying mechanical force to a portion of the surface on which the nanostructured material is located. The step of applying mechanical force may scratch the surface.

It may comprise contacting the surface with an object comprising a material which is softer than the nanostructured material. It may comprise contacting the surface with an object comprising aluminum. It may comprise contacting the surface with an object which leaves material on the surface.

In some embodiments, the step of removing the nanostructured material and insulating material comprises heating or cooling. The heating may be performed employing a laser which is scanned across the surface. The heating may cause rapid localized expansion.

In some embodiments, the step of depositing a conductor comprises electrodeposition or electroless plating. The electrodeposition may comprise, for example, electroplating. The deposition of a conductor may be also carried out, for example, by means of a physical deposition process, which may comprise, for example, sputtering or evaporation. The deposition may also alternatively, for example, comprise screen printing.

In some embodiments, the deposited conductor may have electrical contact with the substrate only in the portion of the surface where nanostructured material was not removed. The deposited conductor may be of a wide variety of materials, for example materials comprising nickel or silver or copper or aluminum, or materials which do not comprise silver.

Following the deposition, it may be that all or most of the nanostructured material is removed in a further processing step. In some embodiments, a substrate may be used which has nanostructuring on two opposing surfaces. The removal of nanostructuring and deposition of conductor may be carried out on each of the two opposing surfaces. In some embodiments, the electrically insulating material employed may provide passivation.

In some embodiments, an optoelectronic device is provided comprising a substrate, a nanostructured area on a first surface of the substrate, an insulating layer atop the first surface, a segment of the nanostructured area where the nanostructures are at least partially broken or removed, optionally a covering layer atop the segment, and a conductor atop the insulating layer and optional covering layer.

In some embodiments, the covering layer may comprise aluminum. In some embodiments, the insulating layer may comprise alumina. The segment may comprise a grid shape. The conductor may make electrical contact to the substrate through the covering layer and the segment. The segment may comprise a plurality of holes in the insulating layer. The holes may have a diameter between about 25 nm and about 250 nm. They may expose the substrate. In some embodiments, the conductor may make electrical contact to the substrate through the covering layer and the plurality of holes in the insulating layer.

The optoelectronic device may be a photovoltaic cell. The cell's power conversion efficiency may be at least about 10% or at least about 15% for AM1.5G simulated sunlight.

In some embodiments, an optoelectronic device comprises a substrate, a nanostructured area on a first surface of the substrate, a passivation layer atop the first surface, a segment of the nanostructured area where there is a plurality of holes in the passivation layer, an optional covering layer atop the segment, and a conductor atop the passivation layer and optional covering layer.

In some embodiments, a process for electroplating a substrate is provided. In that process, alumina is deposited on the substrate. The alumina is patterned so that the presence of alumina over portions of the substrate is substantially eliminated. The substrate is placed in an electroplating solution in a suitable holder. An appropriate current is applied to achieve a thickness of electroplated material atop the substrate. The electroplating may take place solely or predominantly in the portions of the substrate where the presence of alumina was substantially eliminated.

DETAILED DESCRIPTION OF THE INVENTION

Figure 1:
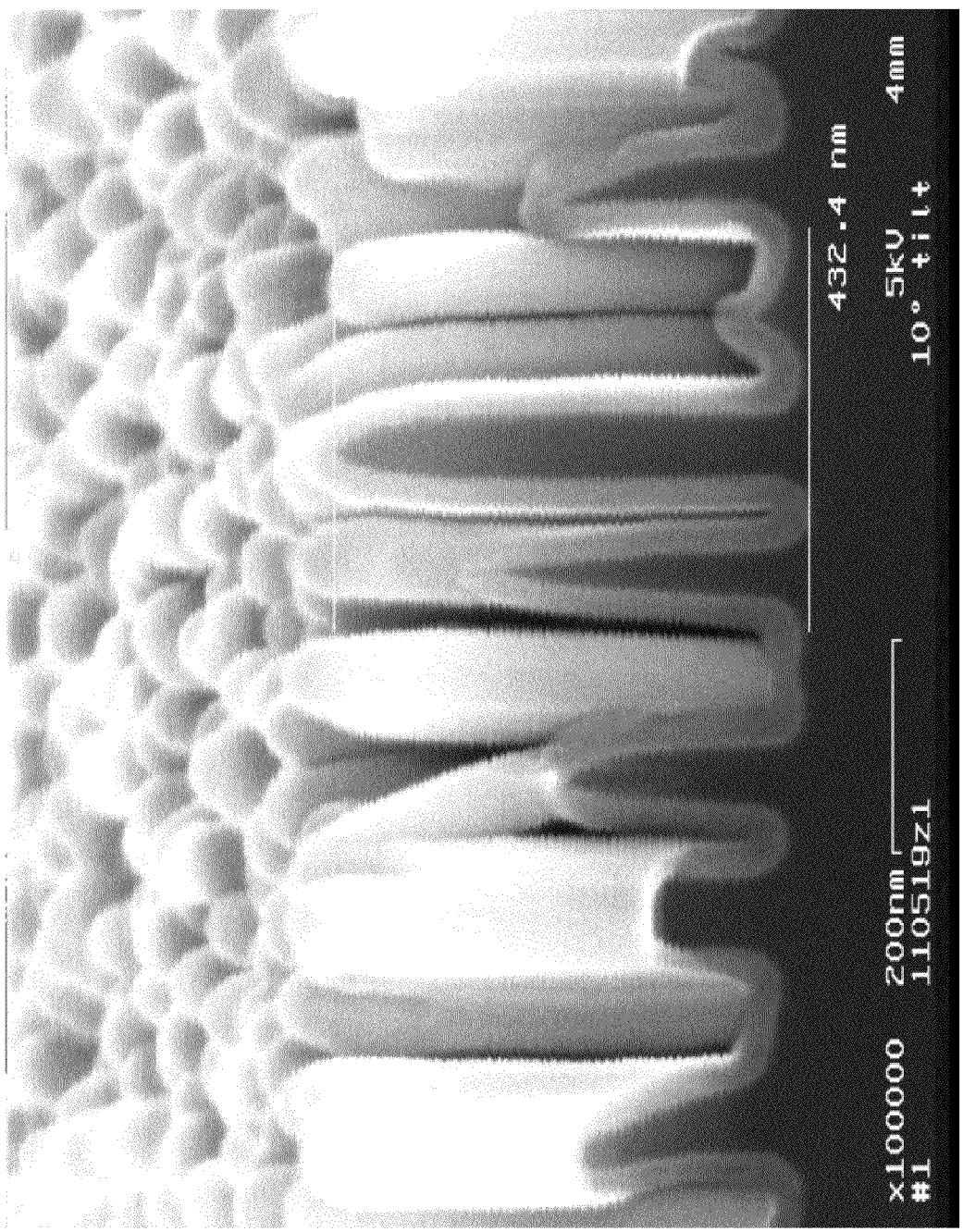
FIG. 1 depicts an edge view scanning electron micrograph of silicon nanowires coated with alumina.

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

A process is provided for contacting a nanostructured surface. In that process, a substrate is provided having a nanostructured material on a surface, the substrate being conductive and the nanostructured material being coated with an insulating material. A portion of the nanostructured material is at least partially removed. A conductor is deposited on the substrate in such a way that it is in electrical contact with the substrate through the area where the nanostructured material has been at least partially removed.

A variety of processes may be used to perform the step of at least partially removing the nanostructured material. Some of the considerations that are relevant to the choice of a removal process are as follows.

A common way to remove a portion of the nanostructured material is to use a mechanical object which communicates shear stress to the nanostructured material. The mechanical object which is used to provide shear stress to the nanostructured material desirably possesses a hardness which is lower than that of the substrate to avoid mechanical cleavage of or abrasion to the bulk substrate material or to otherwise affect any of the device structure outside of the nanostructures (for example nanowires) and their bases.

The Mohs scale of mineral hardness characterizes the scratch resistance of various materials through the ability of a harder material to scratch a softer material. Elemental crystalline silicon has a Mohs hardness of 6.0-7.0. Aluminum has a Mohs hardness of 2.5-3.0, while unhardened steel has a hardness of 4.5-5.0. Since certain alloys of steel and aluminum are less hard than silicon, they are well suited for use as a mechanical object to shear nanostructures such as nanowires. It may be desired to use a material with a Mohs hardness of approximately 0.2 to 0.8 that of the material being abraded, or approximately 0.4 to 0.6 that of the material being abraded. Without wishing to be bound by theory, it is believed that the nanostructures (e.g. nanowires) perform the function of geometrical stress concentrators, such that the softer material is able to cleave-off the harder material, specifically because of the geometry, leaving the underlying material (e.g., bulk silicon) un-deformed.

The shape and dimensions of the area where nanostructures are removed are determined by factors such as the tip shape of the mechanical object, the process to deliver force to the substrate, and the amount of force delivered to the substrate. A number of tip shapes are possible, including single tips, a comb of 4-100 tips, arrays of tips, spring-loaded tips, retractable tips, atomic force microscope tips, and tips with substantially large faces. Metal features created by the process may be simple lines, line arrays, crossed line arrays, or of arbitrary shapes determined by a manually or machine controlled tip scanning system. The dimensions achievable with the approach span a wide range, including nanometer scale by using high stiffness atomic force microscope tips, micrometer range using stainless steel tips, or millimeter range using large blunt tips. By utilizing sequential shearing steps in adjacent areas, one can form larger areas of exposed substrate material (e.g., silicon). Spring-loaded tips may be utilized to retain contact between the mechanical object and the substrate from which nanostructured material is being removed in the case of gradual abrasion. It may be useful to control the force with which the tip contacts the workpiece, for example to have a force between approximately 0.1 and 10 N, or between approximately 0.5 and 2.5 N.

One method of selectively removing nanostructuring in a manufacturing process is to have silicon wafers, with one side covered in nanostructured silicon, placed on a conveyor belt, and moved under a comb of metal tips that scratch the surface forming rows where the nanostructure is removed. The wafers can then be rotated 90 degrees and sent through another comb of metal tips thus producing an array of crossed lines of exposed silicon, an example of a grid pattern. They may alternatively be rotated 60 degrees one or two times producing a partial or complete hexagonal grid. The silicon wafers can then have metal deposited onto the exposed silicon surface by, for example, electroplating.

In an aspect of this disclosure, the shearing force may be delivered by thermal energy. A rapid thermal change in nanostructured material may additionally contribute to base cleavage. One way to implement a temperature change between the nanostructures and non-nanostructured (bulk) material is to keep the mechanical object used for cleaving at a temperature more than 20, 30, or 50° C. different than the surface. A thermal energy gradient could be delivered locally for example with a scanning laser. The thermal energy can be used in combination with mechanical pressure or separately to cleave off the nanostructured material. Alternatively, a mechanical object used to cleave the nanostructured material may possess a temporally fluctuating temperature profile.

In an aspect of this disclosure, the substrate and nanostructures are comprised of materials other than silicon. Numerous methods of creating nanostructures on the structure are contemplated including vapor liquid solid processes, laser chemical vapor deposition, reactive ion etching, and metal enhanced etching (e.g., as described in the exemplary processes below). Furthermore the metallization process is not limited to any single process and can include sputtering, screen printing, electroplating, and evaporation. For some metal deposition processes, masked deposition or masked etching post metal deposition may be performed. In this case, the local removal of the insulating material (from the cleaving off of nanostructured material) determines areas where the metal contacts the silicon, but the mask determines where metal is deposited and can therefore deposit in some areas on top of the insulating material.

Plating, including electroless deposition and electrochemical deposition, of metal onto the exposed silicon or other substrate is especially well matched for this invention. Common plating processes only deposit onto areas that are electrically conducting. Therefore, the area of silicon with an insulating covering will not have metal deposited, while the area where the nanostructured silicon was removed and silicon is exposed will have metal deposited. Thus in this case, no further masking or lithography is needed to pattern the metal contacts.

In an aspect of this disclosure, the process parameters for deposition of the contact may be adjusted such that adjacent openings in the silicon surface generated by multiple shearing actions are electronically connected above the silicon surface by a wider metal line. So, for example, in the case of alumina-coated silicon nanowires on silicon, the nanowires are cleaved off near their base. The silicon is thus exposed where the wires were removed leaving circular sections of around 50-100 nm in diameter of exposed silicon. Electrodeposition can be adjusted so that it deposits onto the exposed silicon and then over the alumina to form a continuous wire.

A variety of materials may be deposited depending on the device which is being manufactured. The current invention is not meant to be limited to use with certain materials. Some thin film device components which may be deposited with the described processes include metal electrodes for solar cells, interconnects and bus bars for solar cells, and electrodes for sensors, thin film batteries, and transistors. In a further aspect of this disclosure, an optoelectronic device is provided. The optoelectronic device comprises (a) a substrate, (b) a nanostructured area on a first surface of the substrate, (c) an electrically insulating layer atop the first surface, (d) a segment of the nanostructured area where the nanostructures are at least partially broken, (e) an optional covering layer atop the segment, and (f) a conductor atop the insulating layer and optional covering layer. The conductor may make electrical contact with the substrate via the covering layer and the segment. The segment may be, for example, in the form of a grid.

Figure 12A:
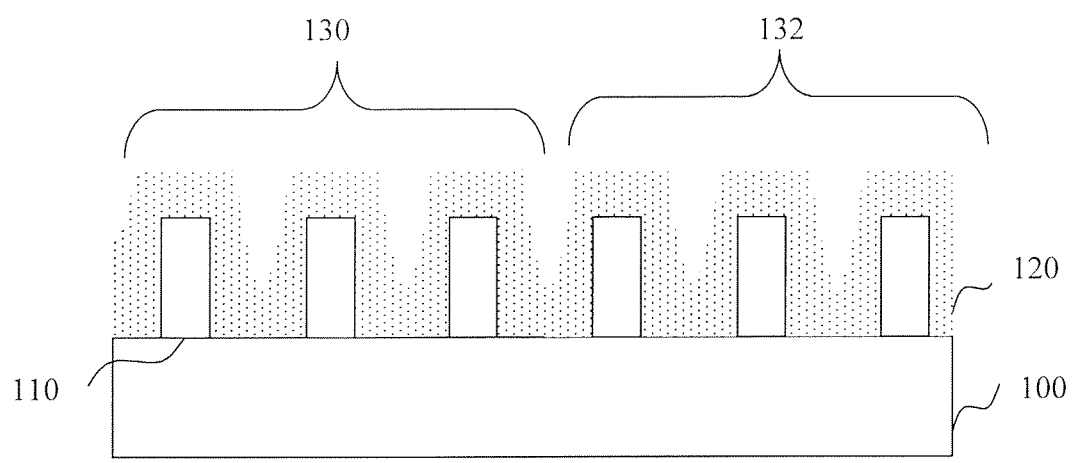
FIGS. 12 A-C depict schematically and not to scale a possible appearance of a workpiece being operated on in some processes of this disclosure.
Figure 12B:
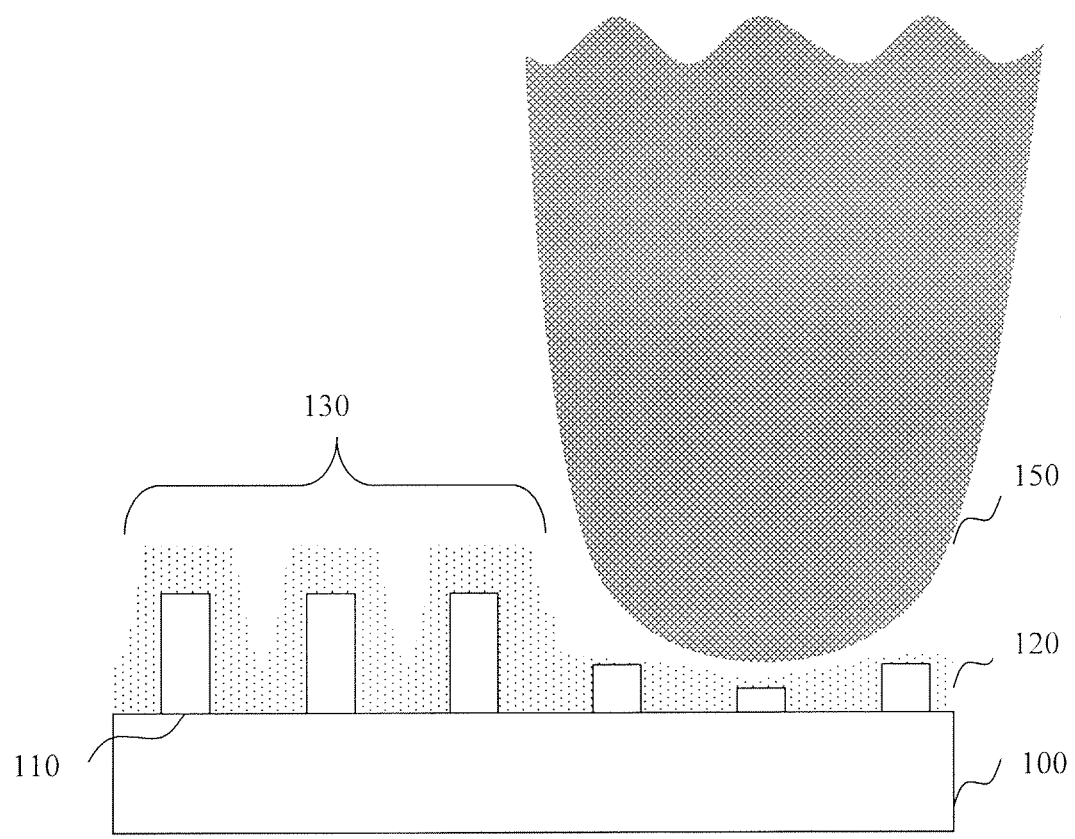
Figure 12C:
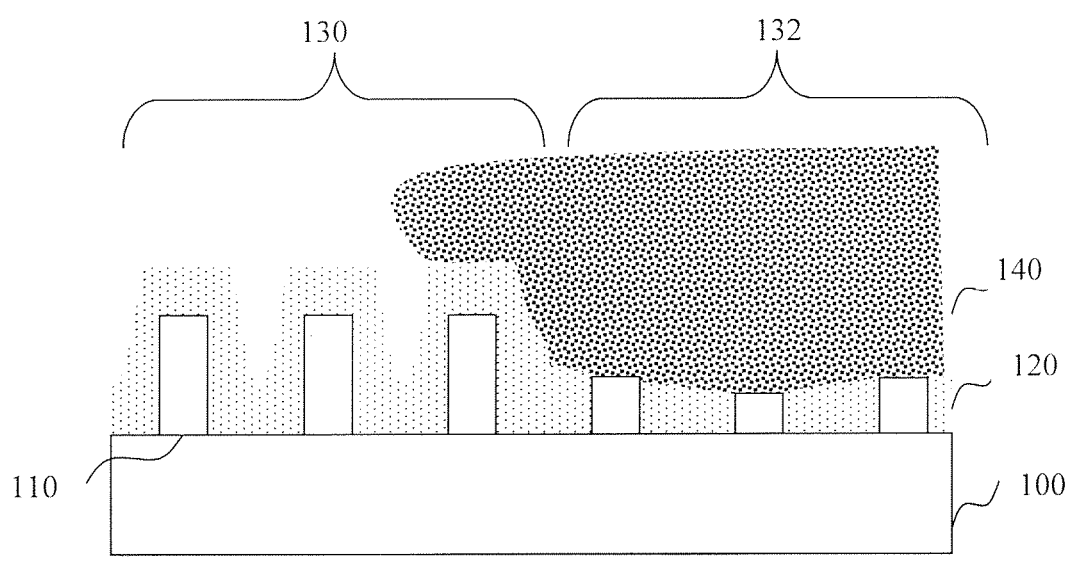

FIGS. 12A-C depict schematically and not to scale a possible appearance of a workpiece being operated on in some processes of the disclosure. FIG. 12A depicts a workpiece to be operated on. In that figure, 100 denotes the substrate. Atop the substrate, there is nanostructuring of which 110 is an example. There is an electrically insulating layer 120 atop the nanostructuring. In one segment 132 of the workpiece the nanostructures will be at least partially broken, whereas elsewhere (130) they will not. FIG. 12B depicts the removal of nanostructuring and the electrically insulating layer in segment 132 by means of the edge 150 of an object. In this figure, the removal is shown as partial. FIG. 12C depicts the result of depositing a conductor 140 following removal. In this figure, the conductor 140 extends somewhat beyond the segment 132.

Figure 10:
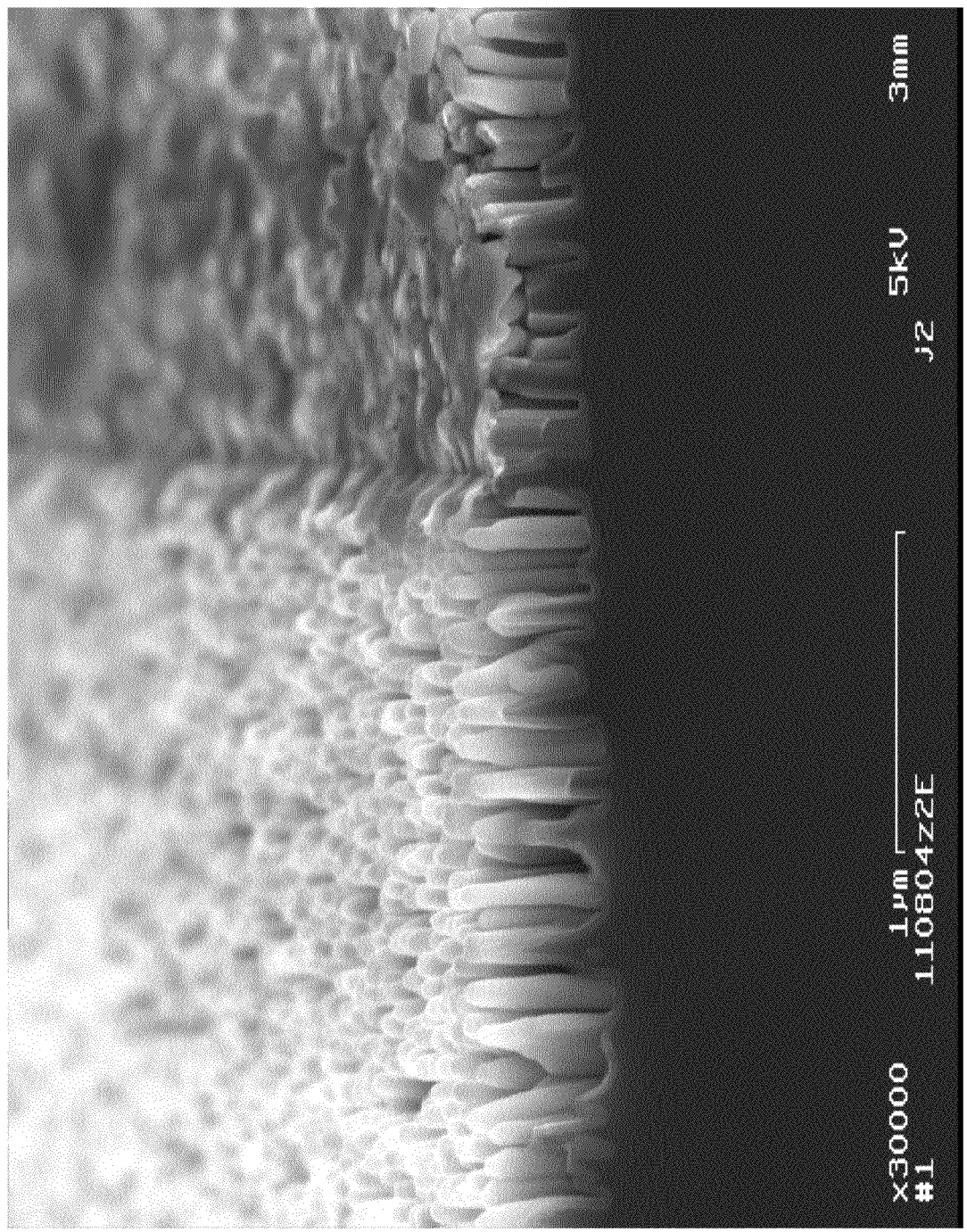
FIG. 10 depicts an edge view scanning electron micrograph of silicon nanowires coated with alumina, where a portion of the nanowires has been removed in accordance with a process of the invention.

An exemplary device of this embodiment is depicted in FIG. 10. A highly schematic diagram of a portion of such a device is shown in FIG. 12C. In that figure, 100 denotes the substrate. Atop the substrate, there is nanostructuring of which 110 is an example. There is an electrically insulating layer 120 atop the nanostructuring. In one segment 132 of the device the nanostructures are at least partially broken, whereas elsewhere (130) they are not. The conductor 140 exists above the insulating layer. In FIG. 12C the optional covering layer is not shown.

The covering layer may be a layer which is deposited as a result of the process of nanostructure breaking, for example by being abraded from the tool which carries out this process. The covering layer may be conducting. The covering layer may improve the electrical contact of the conductor. The covering layer may diffuse into the substrate, for example, aluminum into silicon, as a side effect of the manufacturing process employed or deliberately as a result of the design of that process. If such diffusion occurs, a selective emitter may be formed.

In what follows, exemplary processes of the invention are described. The following examples are put forth so as to provide those of ordinary skill in the art with a more complete disclosure and description of how to implement the invention, and are not intended to limit the scope of what the inventors regard as their invention. Efforts have been made to ensure accuracy with respect to numbers (e.g., amounts, temperature, etc.) but some errors and deviations should be accounted for.

Exemplary Process 1

Figure 11:
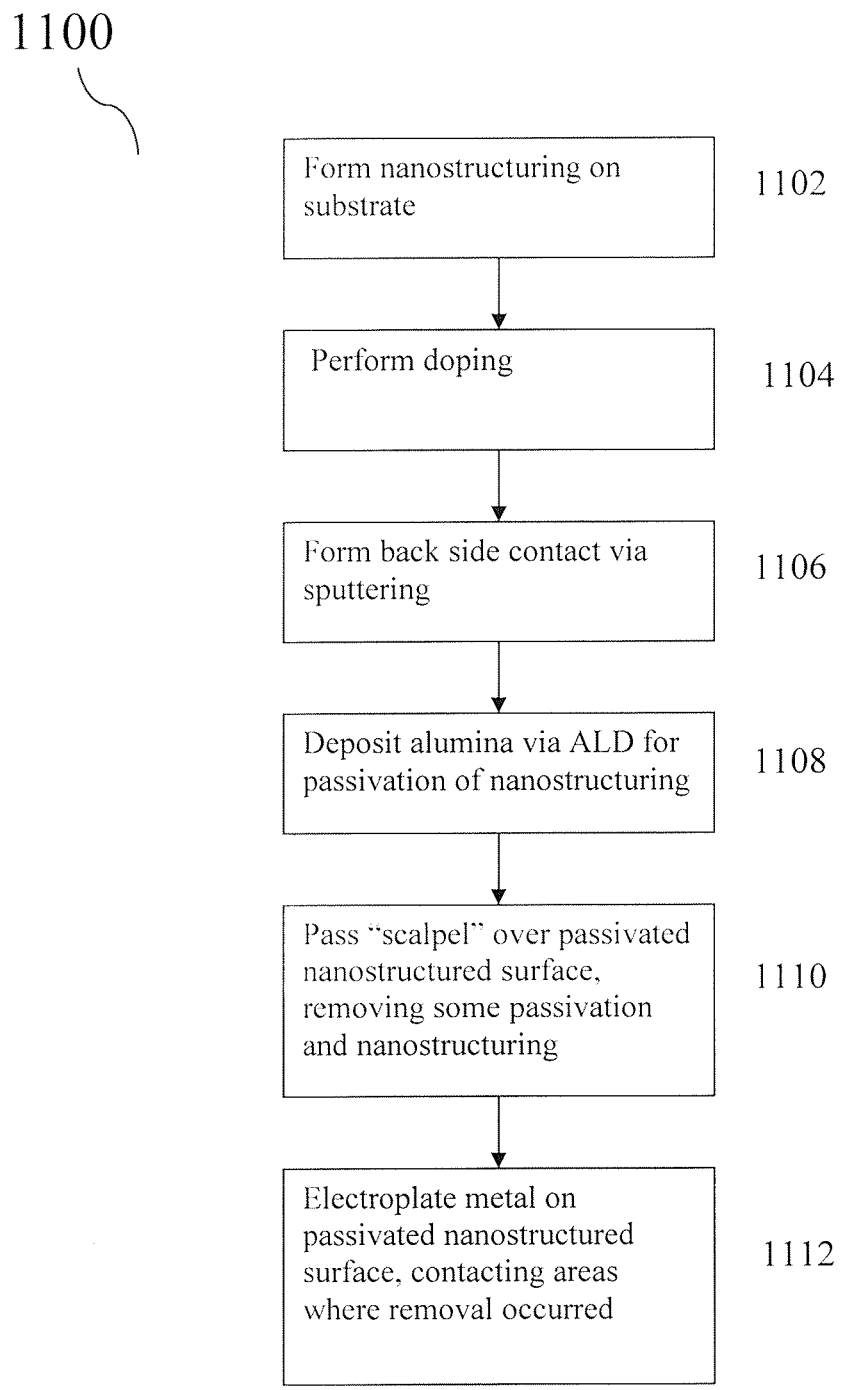
FIG. 11 depicts a high-level flow chart according to some embodiments of the present disclosure.

FIG. 11 provides a high-level view 1100 in flowchart form of the exemplary process described below. The steps may be summarized in the following six blocks shown in the figure: Block 1102: Form nanostructuring on substrate. Block 1104: Perform doping to create a pn junction. Block 1106: Form back side contact via sputtering. Block 1108: Deposit alumina via ALD for passivation of nanostructuring. Block 1110: Pass "scalpel" over passivated nanostructured surface, removing some passivation and nanostructuring. Block 1112: Electroplate metal on passivated nanostructured surface, contacting areas where removal occurred.

N-type silicon material with a resistivity of 1 ohm-cm is selected having a surface with a (100) crystallographic orientation.

The first step is to deposit 50-170 Å of silver which will be used for metal enhanced etching. The wafer is loaded into a sputtering chamber and silver is sputtered at a rate of 2-4 Å/s, a base pressure of <1e-6 Torr, and an argon pressure of 2e-3 Torr.

The next step is the nanowire formation in an oxygen/HF bath. After the sample is removed from the sputtering chamber, it is placed in a dilute hydrofluoric acid (HF) bath. The bath contains 10 parts volume water to 1 part volume HF. The sample is etched in the HF bath for 10 minutes during which time oxygen is bubbled vigorously through the HF using a perforated plastic tube. After the sample is rinsed three times in deionized water (DI).

The silver is then removed and the sample is cleaned in a series of wet baths. The first bath is a piranha clean which consists of 4 ml of sulfuric acid ($H_2SO_4$) to 1 ml of 30 wt % hydrogen peroxide ($H_2O_2$) at 70° C. Prior to placing the wafer into the piranha, it is stirred for 2 minutes. The stirring is then commenced and the wafer is submerged for 15 minutes. After the piranha etch, the wafer is cleaned 3 times with DI water.

The sample is then placed in dilute HF for 30 seconds. This HF solution has a volume ratio of 24:1 of water to 49% HF and is at room temperature. The wafer is then rinsed three times with DI water.

Next, a traditional 10 minute SC1 clean is done. This is a bath of 5:1:1 volume ratio of water, 30 wt % ammonium hydroxide ($NH_4OH$), and 30 wt % hydrogen peroxide and is at 70° C. Again the wafer is rinsed three times in DI water.

After the SC1 clean an SC2 clean is performed on the wafer. This clean is a 10 minute soak at 70° C. in 5:1:1 volume ratio of water, 37 wt % hydrochloric acid (HCl), 30 wt % hydrogen peroxide. The sample is then rinsed three times in DI water.

The next step in forming solar cells is to dope the samples to create a pn junction. For this doping process the dopants are first placed onto two source wafers. One source wafer will dope the front, nanowire, side of the wafer and will have boron doping. The other source wafer will have phosphorus and will dope the back side of the sample wafer. The source wafers will be used to dope the sample wafer.

In order to prepare the two source wafers, they are first cleaned with the piranha, HF, SC1, and SC2 cleans as described above.

Boron is spun onto one source wafer using the boron film spin-on diffusant B-153 (Filmtronics). The dopant is spun on using a 5 second prespin at 500 RPM and then a 15 second spin at 5000 RPM.

A small dime-size spot of Filmtronics phosphorus film spin-on diffusant P-506 is dropped onto the second source wafer. Both source wafers are then baked at 250° C. on a hot plate for 10 minutes.

Next the stack of wafers used to dope the sample wafer is formed. The boron source wafer boron is placed boron side up on a quartz disc. Then three 525 micron thick spacers of silicon are placed on the edges of the wafer. The sample wafer is then placed nanowire side down on the boron source wafer, three more spacers are placed on the edges of the wafer, and the final source wafer (the phosphorus-doped source wafer) is placed phosphorus side down facing the non-nanowire side of the sample wafer.

The full stack including the two source wafers, spacers, and sample wafer are then pushed into a furnace tube with argon flowing at 2000 standard cubic centimeters per minute (SCCM) from room temperature to 1050° C. in 1 minute 30 seconds. The furnace is then held at a flow rate of argon of 2000 SCCM and a temperature of 1050° C. for 5 minutes, at which point 500 SCCMS of oxygen is added to the flow and the temperature is ramped down at 6 degrees per minute, for 15 minutes. After 15 minutes, the oxygen is switched off while the argon is left on and the furnace is allowed to cool to 745° C. The stack is then pulled out and cooled to room temperature in atmosphere. The sample wafer is removed from the stack. The next step is the back contact. The sample wafer is first cleaned in a 10 minute HF dip with 4 ml of water to 1 ml of HF and rinsed three times. Following the HF clean, the sample is placed, face up in a sputtering tool and a metal stack of 2000 A tungsten, 30,000 Å silver, and 4,000 Å tungsten is deposited.

The sample wafer is again cleaned in a 4:1 HF dip, this time for 30 seconds and rinsed three times in DI water.

The next step is to place alumina passivation on the nanowire array. This employs atomic layer deposition (ALD) of alumina, which provides electrical passivation on the nanowire arrays and serves as an insulating mask for electro-deposition. The samples are placed inside the ALD chamber. The ALD system may be, for example, a Cambridge Nanotech Savannah 5200. The ALD chamber is preheated to 250° C. prior to loading our samples. After the samples are loaded, the chamber is pumped with a rough pump while a constant flow of $N_2$ at 20 SCCMs is introduced into the chamber. The pressure is around 2200 mTorr with this process. The program is set to make the process wait until the heaters are at 250° C. Once the temperature is at 250° C., the program waits another 60 seconds and pulses water, and then with trimethylaluminum (TMA). An automatic pulse control program is executed alternating between water and TMA for a total of 275 cycles.

FIG. 1 depicts an edge view scanning electron micrograph of silicon nanowires coated with alumina. The cleaved edge illustrates the alumina coating.

The next step is cleaving off a row of nanowires by rubbing the nanowire side of the wafer with a sharpened aluminum blade, using a stencil to guide the blade (which blade may be referred to as a "scalpel"). The aluminum blade was prepared by using steel to sharpen an aluminum shard cut from a sheet. The blade was manually controlled. Several scratches were made across the substrate with variable applied force.

The sample was contacted on the back with a copper wire and silver paint onto the tungsten back contact. This was covered with silicone adhesive teflon insulating tape. The sample is placed into electroplating solution.

Nickel electroplating was carried out using nickel sulfamate SN-10 from Transene Co. (Danvers, Mass.) at a constant current density of 20 mA/cm$^2$ at 50° C. for one hour.

After the nickel is electroplated in the areas of exposed silicon, the sample is annealed in forming gas for 1 hour at 390° C.

For this particular sample, the nickel was determined to be too thin, and therefore the sample was placed back into the nickel sulfamate as previously described and was plated at the same conditions for another hour.

Figure 2:
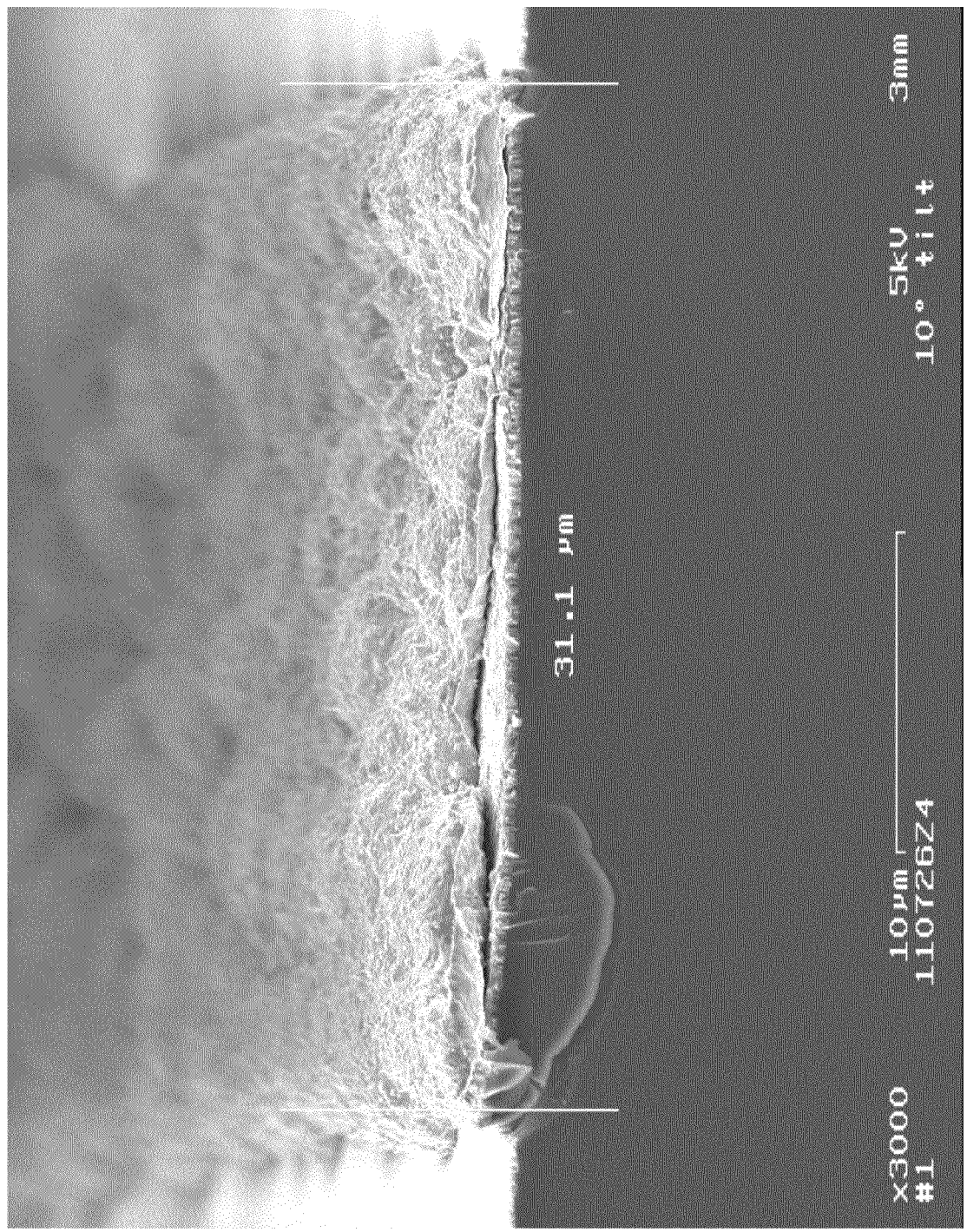
FIG. 2 depicts a top view scanning electron micrograph of a line produced by exemplary process 2.

FIG. 2 depicts a top view scanning electron micrograph of a nickel line produced by this exemplary process.

Figure 3:
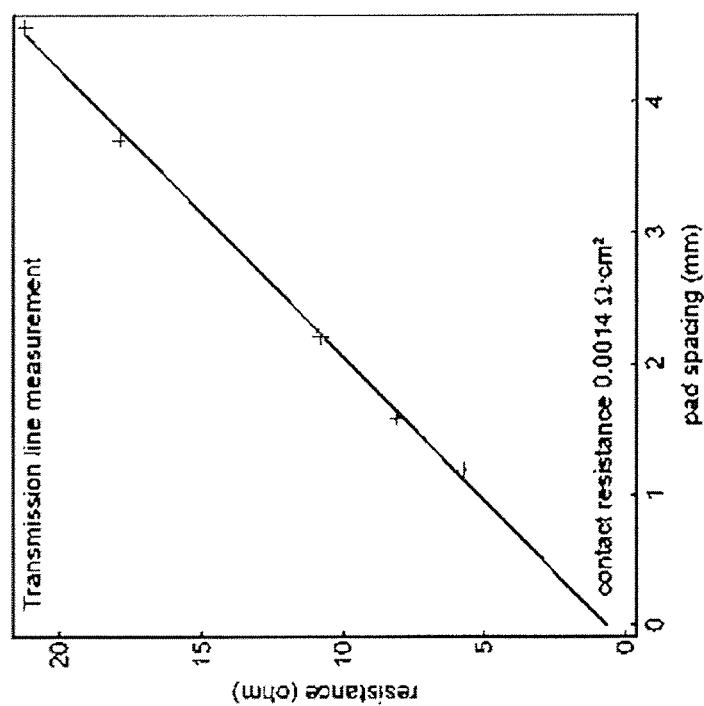
FIG. 3 depicts a transmission line measurement of a line produced by exemplary process 2.

FIG. 3 depicts a transmission line measurement of a line produced by this exemplary process. The contact resistance is 0.0014 $\Omega$-cm$^2$.

Figure 4:
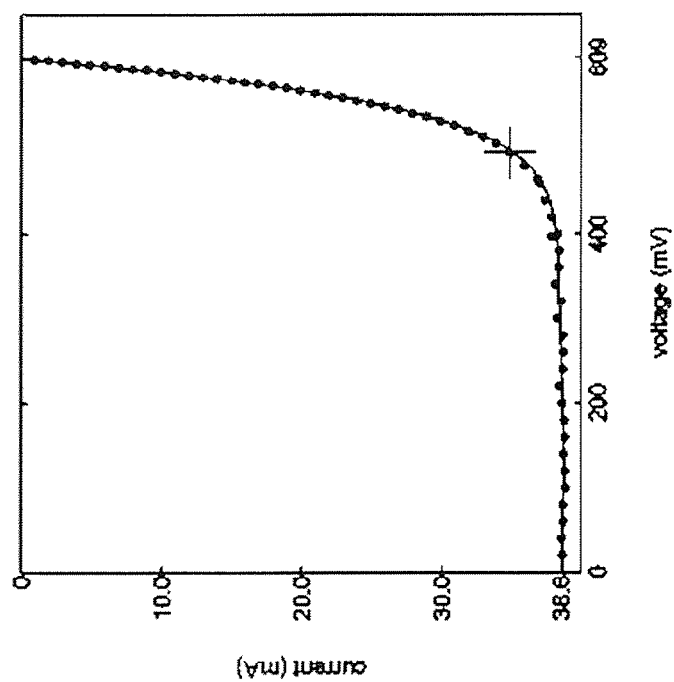
FIG. 4 depicts a current voltage trace of a diode with a metal electrode produced by exemplary process 2.

FIG. 4 depicts a current-voltage trace of a diode with a metal electrode produced by this exemplary process. The power conversion efficiency for AM1.5G simulated sunlight for such a diode has been shown to be in excess of 17%.

Exemplary Process 2

A variation on the previously described process was employed where, instead of an aluminum "scalpel," a stainless steel razor blade was used to scratch the nanowires. The razor was manually controlled, guided by a laser cut invar stencil placed on the substrate. Several scratches were made across the substrate with variable applied force.

Figure 5:
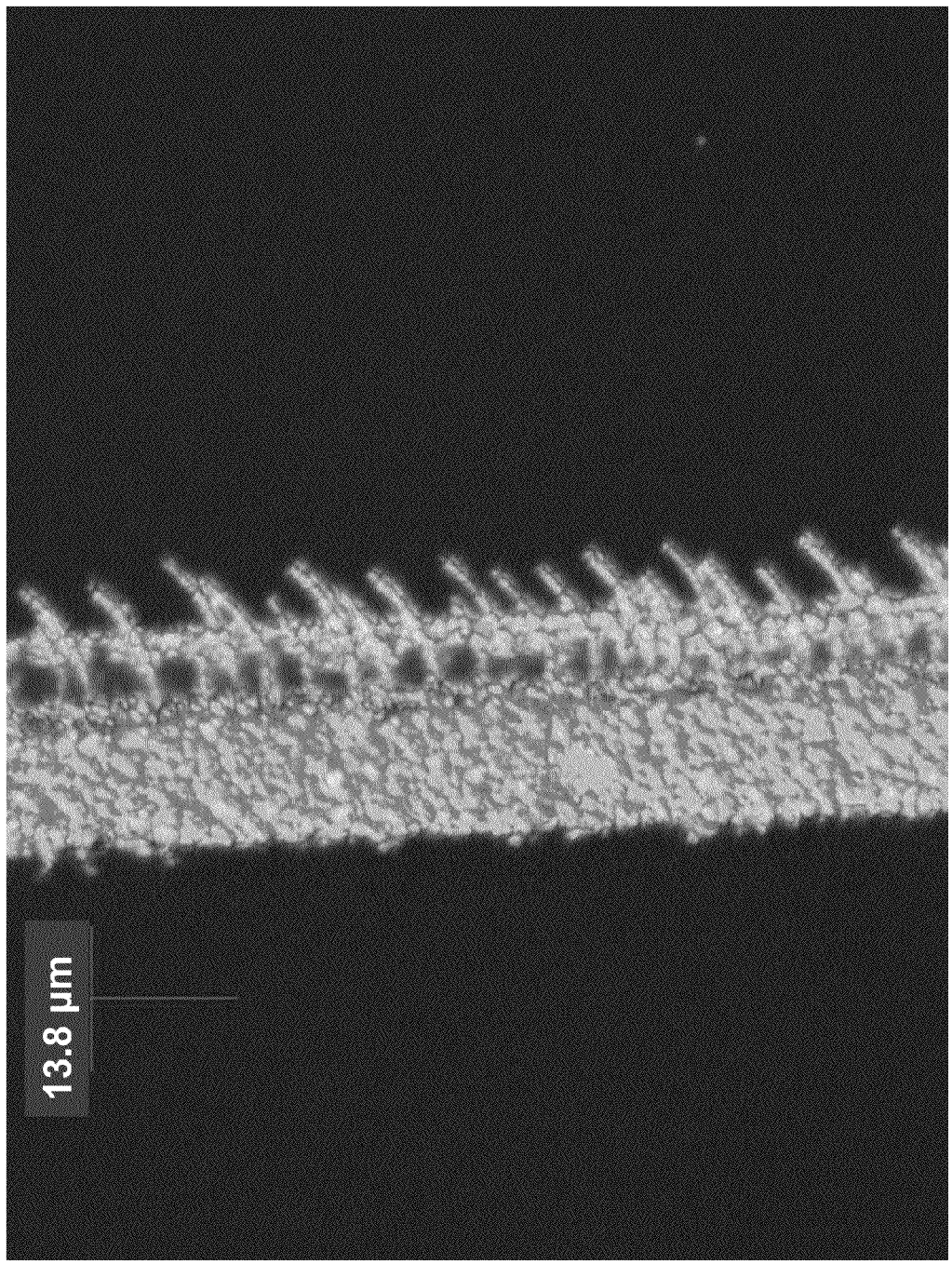
FIG. 5 shows an optical micrograph of a line produced by exemplary process 1.

FIG. 5 shows an optical micrograph of a line produced by this exemplary process. The scale bar shows that the metal line is less than 15 micrometers wide.

Figure 6:
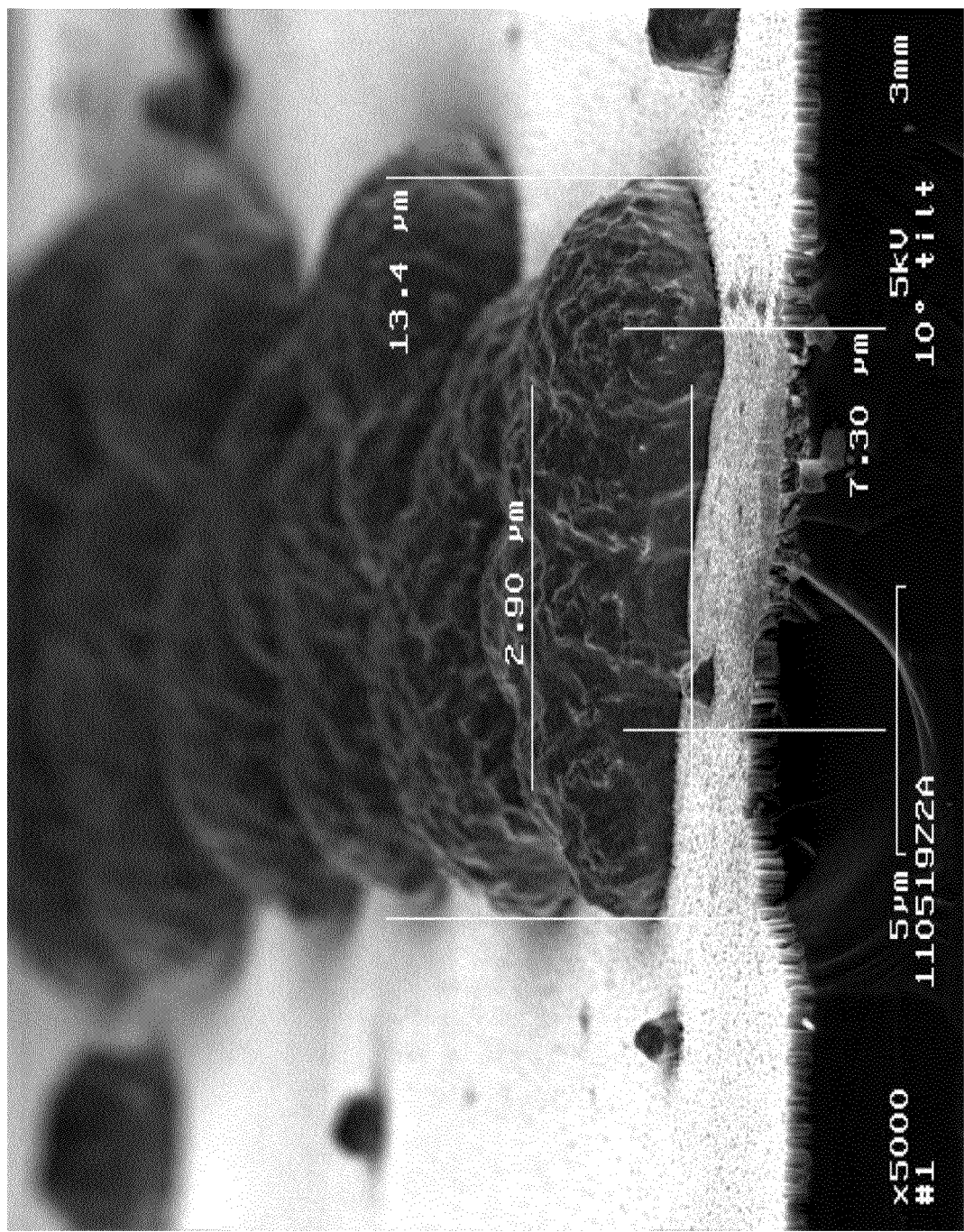
FIG. 6 depicts an edge view scanning electron micrograph of a line produced by exemplary process 1.

FIG. 6 depicts an edge view scanning electron micrograph of a nickel line produced by this exemplary process. The scratch width (inner horizontal dimension) is 7.3 micrometers wide, and the metal line is approximately 13 micrometers wide and rises 2 micrometers above the top surface of the nanowires.

Figure 7:
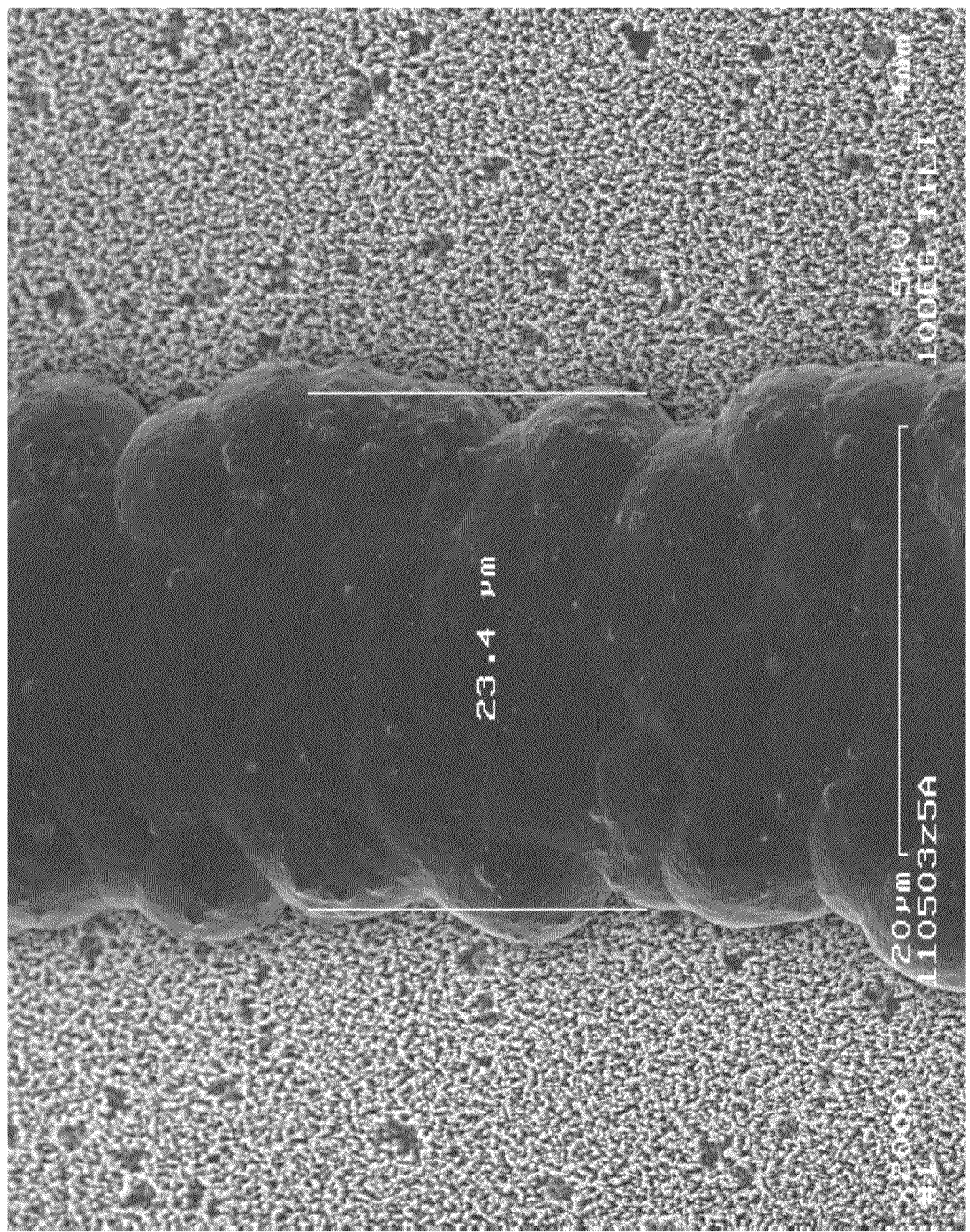
FIG. 7 depicts a top view scanning electron micrograph of a line produced by exemplary process 1.

FIG. 7 depicts a top view scanning electron micrograph of a nickel line produced by this exemplary process. The metal line is approximately 23 micrometers.

Exemplary Process 3

An alternative to the preceding processes can also be employed to utilize sputter coating for metal deposition. This process begins the same as exemplary process 1 in the formation of alumina coated nanowires.

A photoresist (Microchem SF9 PMGI, P/N G113109) is spun onto the alumina-coated silicon nanowire surface. The substrate is then baked at 180° C. for 20 minutes to drive off solvents.

Next, a stainless steel razor blade is used to scratch the nanowires. The razor is manually controlled, guided by a laser cut stencil placed on the substrate. Several scratches can be made across the substrate with variable applied force.

Figure 8:
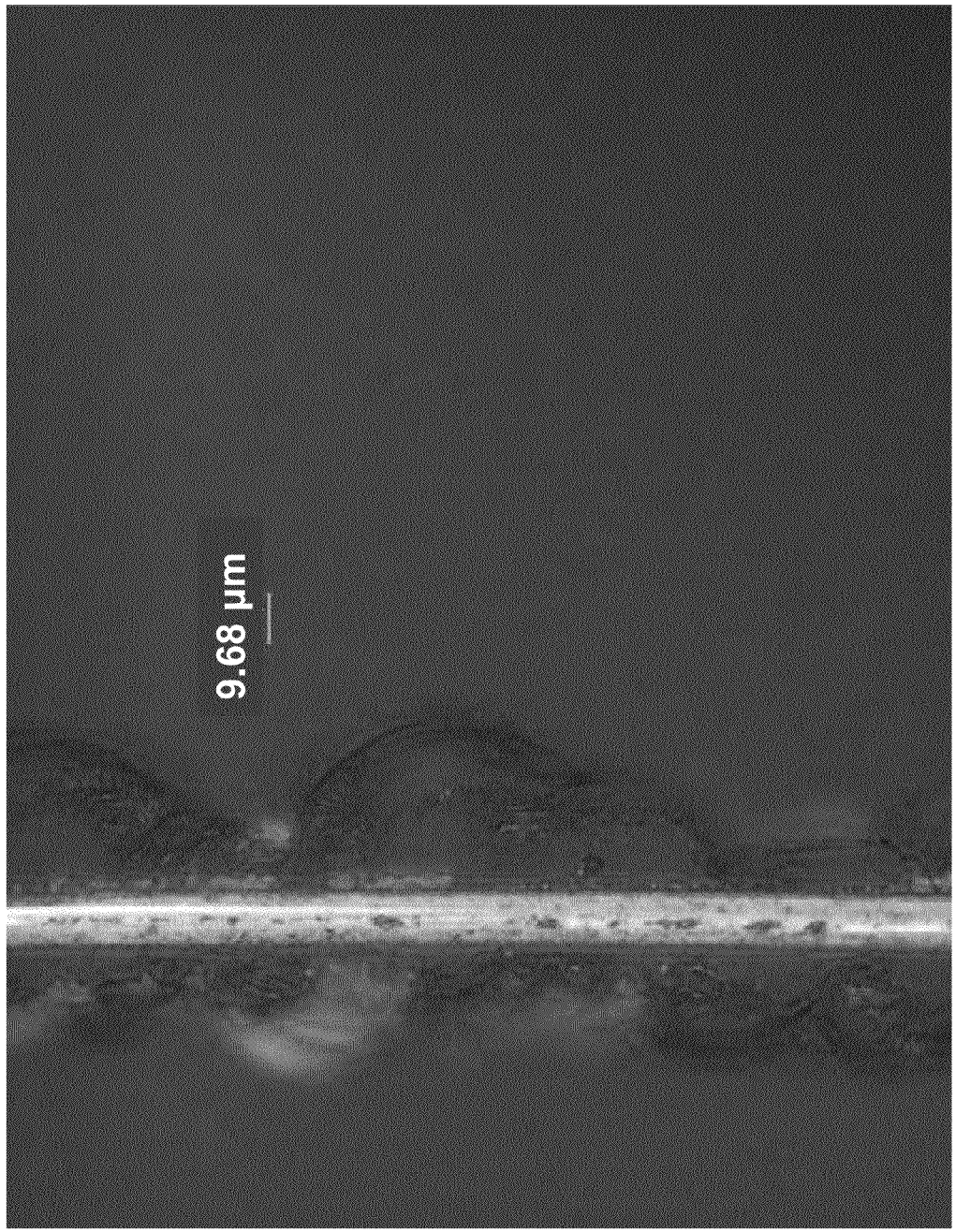
FIG. 8 depicts an optical micrograph showing a scratch through the photoresist deposited on top of the wires prepared by exemplary process 3.

FIG. 8 depicts an optical micrograph showing a scratch through the photoresist deposited on top of the wires prepared by this exemplary process. The scratched area is approximately 10 micrometers wide.

The next step is cleaning the photoresist from the scratched section of the wafer with an ultraviolet ozone clean for 60 seconds at 25° C. This is followed by a 30 second dip in HF to etch the oxide from the scratched area. Before commencing the etching reaction, the HF solution is seasoned by bubbling oxygen through the HF. The concentration of HF was approximately 9% by weight.

Next, 650 nm of silver is sputtered onto the sample wafer using a shadow mask and the photoresist is lifted off with an organic solvent, leaving silver only in the areas that were scratched.

Figure 9:
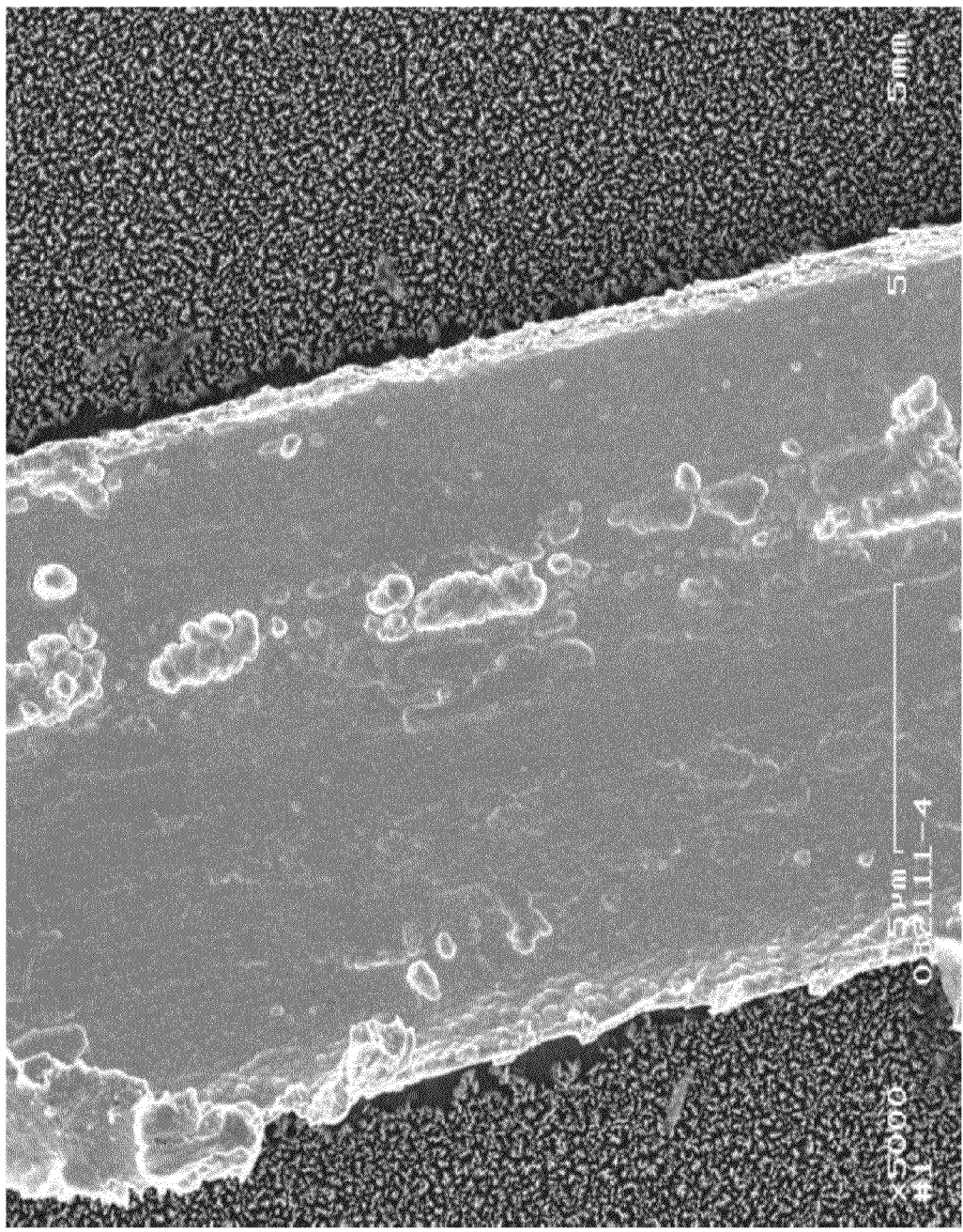
FIG. 9 depicts a top view scanning electron micrograph showing a metal line sputtered through the photoresist mask subsequent to liftoff prepared by exemplary process 3.

FIG. 9 depicts a top view scanning electron micrograph showing a metal line sputtered through the photoresist mask subsequent to liftoff prepared by this exemplary process.

In an alternative embodiment, the nanowire array could be etched off after the metal step with a 5-60 sec standard KOH etch. This has utility where there is no need for a nanowire array in the final product.

D. Applications

Processes and device designs of the invention may be applied to contacting silicon nanowire arrays for optoelectronic devices. They may be employed in devices that utilize the photoelectric or photovoltaic effect, for example solar cells, photodetectors, photodiodes, phototransistors, photomultipliers and integrated optical circuits.

Processes and designs of the invention may be employed to produce devices made out of or comprising polycrystalline silicon. The invention encompasses processes and designs, which can be used with any crystalline orientation of silicon including polysilicon. Polysilicon is a cheaper material than crystalline silicon, but it is typically more difficult to texture and structure than single crystal silicon due to the random orientation of the grains. The processes and design of the invention can likewise be used to contact nanowires in amorphous silicon.

Arrays of silicon nanowires can be used in applications where the silicon will be subjected to stress or strain where the nanostructure is able to absorb and relax this stress or strain. For example, nanowires can act as an interfacial layer between bulk silicon and another material grown on top, which is not lattice-matched to it.

Processes described in this application are also applicable to lithium ion battery technology. Silicon has been seen as a desirable candidate for the anode material in lithium ion batteries due to its low discharge potential and high charge capacity. Its application in the past has been limited due to the large change in volume associated with ion insertion and ion extraction. The large amounts of stress and strain that builds in the silicon results in degradation of the silicon layer resulting in a very short performance lifetime. Nanowires have been pursued due to their ability to withstand these stresses and strains. The fact that porous silicon (nanopores or micropores) can also be contacted via processes described in this application would enable the fabrication of another anode geometry capable of withstanding the stresses and strains of ion insertion/extraction for lithium ion battery applications.

Processes and designs described in this application may be used to contact nanostructures, which make silicon into an intermediate band photovoltaic material (IBPV). Silicon has an excellent band structure for IBPV, provided that the strength of particular electronic transitions can be enhanced. One way to do this is to form a dense array of silicon nanowires with specific control over the wire diameter, doping and crystallographic orientation. Processes and designs described in this application may be used for contacting such nanowire arrays.

Processes and designs described in this application may be used to contact nanostructures which are formed for the purpose of being able to make electrical contact via such processes and designs, even if those nanostructures are not required subsequently to the formation of the electrical contact.

The following references may be relevant to this application: (1) I. Tobias, C. del Canizo, J. Alonso, "Crystalline silicon solar cells and modules," Chapter 7 in A. Luque, *Handbook of Photovoltiac Science and Engineering* (John Wiley & Sons 2003). (2) Sami Franssila, *Introduction to Microfabrication* (2d ed. John Wiley & Sons 2010). (3) K. Kang, W. Cai, "Size and temperature effects on the fracture mechanisms of silicon nanowires: Molecular dynamics simulations," *International Journal of Plasticity* 26, 1387-1401 (2010). (4) B. A. Gozen O. B. Ozdoganlar, "A Rotating-Tip-Based Mechanical Nano-Manufacturing Process: Nanomilling," *Nanoscale Research Letters* 5, 1403-1407 (2010), (5) U.S. Published Patent Application No. 2012/181502 to Modawar et al.

All patents, patent applications, and publications mentioned in this application are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

The invention claimed is:

1. A process comprising: (a) providing a substrate having a nanostructured material on a surface, the substrate being conductive and the nanostructured material being coated with an insulating material, (b) removing the nanostructured material and electrically insulating material at least partially from a portion of the surface and (c) depositing a conductor on the substrate in such a way that the conductor is in electrical contact with the substrate through the portion of the surface where the nanostructured material and insulating material has been at least partially removed.

2. The process of claim 1, wherein the substrate and the nanostructured material comprise silicon.

3. The process of claim 2, wherein the nanostructured material comprises porous silicon.

4. The process of claim 1, wherein the nanostructured material comprises nanowires.

5. The process of claim 4, wherein the nanostructured material comprises an array of nanowires.

6. The process of claim 1, wherein the insulating material comprises silicon dioxide.

7. The process of claim 1, wherein the insulating material comprises alumina.

8. The process of claim 1, wherein the step of removing the nanostructured material and insulating material comprises applying mechanical force to a portion of the surface on which the nanostructured material is located.

9. The process of claim 8, wherein the step of applying mechanical force scratches the surface.

10. The process of claim 8, wherein the step of applying mechanical force comprises contacting the surface with an object comprising a material which is softer than the substrate material.

11. The process of claim 8, wherein the step of applying mechanical force comprises contacting the surface with an object comprising aluminum.

12. The process of claim 8, wherein the step of applying mechanical force comprises contacting the surface with an object which leaves material on the surface.

13. The process of claim 1, wherein the step of removing the nanostructured material and insulating material comprises heating or cooling.

14. The process of claim 13, wherein the heating is performed employing a laser which is scanned across the surface.

15. The process of claim 13, wherein the heating causes rapid localized expansion.

16. The process of claim 1, wherein step (c) comprises electrodeposition or electroless plating.

17. The process of claim 16, wherein the electrodeposition comprises electroplating.

18. The process of claim 1, wherein the deposited conductor does not have electrical contact with the substrate in the portion of the surface where nanostructured material was not removed in step (b).

19. The process of claim 1, wherein the deposited conductor does not contain silver.

20. The process of claim 1, wherein the deposited conductor comprises nickel.

21. The process of claim 1, wherein the step of depositing a conductor comprises a physical deposition process.

22. The process of claim 21, wherein the physical deposition process comprises sputtering or evaporation.

23. The process of claim 1, wherein step (c) comprises screen printing.

24. The process of claim 1, further comprising a step, performed after step (c), of removing all or most of the nanostructured material.

25. The process of claim 1, wherein the provided substrate has nanostructuring on two opposing surfaces, and wherein steps (b) and (c) are carried out on each of the two opposing surfaces.

26. The process of claim 1, wherein the insulating material provides passivation.

27. A process comprising: (a) providing a substrate having a nanostructured material on a surface, (b) removing the nanostructured material from a portion of the surface, and (c) depositing an electrical contact in the portion of the surface from which the nanostructured material was removed.

* * * * *